United States Patent [19]

Huang

[11] Patent Number: 5,694,404

[45] Date of Patent: Dec. 2, 1997

[54] ERROR-CORRECTING VIRTUAL RECEIVING BUFFER APPARATUS

[75] Inventor: Wei-Hung Huang, Miaoli Hsien, Taiwan

[73] Assignee: United Microelectronics Corporation, Hsinchu, Taiwan

[21] Appl. No.: 600,870

[22] Filed: Feb. 13, 1996

[51] Int. Cl.$^6$ .................................................. H03M 13/00
[52] U.S. Cl. .................................................. 371/35
[58] Field of Search .................................. 371/35, 37.1

[56] References Cited

U.S. PATENT DOCUMENTS

| | | | |
|---|---|---|---|
| 4,344,171 | 8/1982 | Lin et al. | 371/35 |
| 4,422,171 | 12/1983 | Wortley et al. | 371/32 |
| 5,528,763 | 6/1996 | Serpanos | 395/250 |

*Primary Examiner*—Stephen M. Baker
*Attorney, Agent, or Firm*—Cushman Darby & Cushman, IP Group of Pillsbury Madison & Sutro, L.L.P.

[57] ABSTRACT

An error-correcting virtual receiving buffer apparatus comprises a buffer, a decoder and a buffer controller. The buffer is coupled to the decoder for temporarily containing encoded data incoming from an external data source and for subsequently outputting the temporarily contained encoded data to the decoder for decoding. The buffer controller comprises a counter for maintaining the count of the data symbols of the encoded data lost in a data overflow condition. The buffer controller issues a buffer suspend control signal to the buffer for suspending subsequent data symbols of the incoming encoded data, in order to prevent storing into the memory array of the buffer. The counter maintains a record of the number of the data symbols lost in the data overflow condition, and the decoder performs error correction schemes to recover the lost data symbols.

5 Claims, 3 Drawing Sheets

ERROR-CORRECTING VIRTUAL RECEIVING BUFFER APPARATUS

BACKGROUND OF THE INVENTION

1. Field of the Invention

The present invention relates in general to a buffer for data reception. In particular, the invention is directed to a buffer for receiving incoming information and correcting data errors without interrupting normal reception of the incoming data stream.

2. Description of Related Art

Codec (code-decode) systems are widely utilized in various arrangements for transmission of both text and graphics information. For example, conventional modem (MOdulator-DEModulator) devices encode data to be transmitted to a remote receiving party before being sent over a communication network. Based on a predetermined transmission protocol, the receiving modem device then decodes its received data stream to reconstitute the information that was originally encoded and transmitted. A copy of the original information is thus duplicated at the receiving end, having the exact format as the original information.

In the art of data storage and retrieval utilizing mass storage devices such as CD-ROM and hard disk drives, data is often stored in an encoded format to enhance storage space efficiency and/or security. Data stored in these devices are normally encoded according to certain error-correcting encoding schemes to guarantee the correctness of received data, and, the data are also frequently encrypted for security. Such data retrieved from the storage devices require prior decoding before they can be meaningfully utilized. Codec systems play the important role in these data encoding and decoding procedures normally involving the transmission of information.

FIG. 1 (Prior Art) is a block diagram of a conventional data receiving decoder device. An incoming data stream is coupled to an input of a receiving buffer 10, which includes an array of registers or memory elements. Due to various status conditions of communication networks, data may flow into receiving buffer 10 at various rates from time to time. A decoder 11 is coupled to an output end of receiving buffer 10 for decoding data buffered by the receiving buffer. Decoder 11 may decode data at a slower rate than data flows into receiving buffer 10. Therefore, receiving buffer 10 may, at times, accumulate and/or hold data that has accumulated. A data output unit 12 is coupled to an output of decoder 11 for outputting data received therefrom. A buffer controller 20 controls receiving buffer 10.

Decoder 11 is an engine that facilitates the decoding of received encoded data from receiving buffer 10. The decoding power of the decoder 11 is closely related to the maximum rate at which the entire data receiving and decoding system is capable of operating. The greater the decoding power of the decoder 11, the higher system throughput will be, with, however, greater demand on associated hardware complexity.

Data output unit 12 transmits decoded data to external devices that require the decoded data. Output units in conventional decoder systems normally relay the decoded data they receive immediately without any delay associated therewith. Therefore the data output rates of conventional output units are not fixed. In some systems, however, output of decoded data must be maintained at a fixed rate per some agreed upon protocol, for example, the decoded data output rate for CDDA is fixed at 176.4 bytes/sec.

Buffer controller 20 controls the operation of receiving buffer 10. For example, buffer controller 20 monitors and controls the condition of data storage overflow in receiving buffer 10. As an example, when there is data overflow, the buffer controller 20 may be able to issue an input rate control signal 13 to a data source (not shown in the figure) which requests that the data source reduce the rate at which it sends data to receiving buffer 10. Reference numeral 15 represents a rate control signal issued by decoder 11 to buffer controller 20.

Normally, the decoder system for implementing the decoding of the received encoded data is closely coupled to the buffer that receives the incoming data. Whenever the data input rate is greater than the decoding rate of the decoder, buffer data overflow occurs. Whenever there is a data buffer overflow condition, the only solution available to conventional data receiving and decoding systems is to request retransmission of the data lost during overflow. If no action is taken in response to a data overflow condition, the result is not only a loss of overflowed data, but the entire stream of data within a transmission block will be shifted out of format, causing a long section of data to become erroneously interpreted. The length of the lost data is dependent on the design of the decoder system. On the other hand, if retransmission of the flawed data was requested, the result is extended total data transmission time.

For example, FIG. 3a shows a typical data format of decoded data under normal transmission conditions. FIG. 3b shows the same data as in FIG. 3a, but flawed by an overflow condition without proper handling to recover the lost data. In the data transmission stream of FIG. 3a, the system generates a synchronization signal every n data symbols. The synchronization signal signifies the start of a new block of data being transmitted.

Under normal conditions, the format of the data transmission stream will be as shown in FIG. 3a. However, when there is, for example, an overflow condition occurring at the fourth data symbol during data transmission, the fourth data symbol is lost altogether and is not written in the encoded data receive buffer. The fifth data symbol is then shifted into the position that should have been occupied by the fourth data symbol and is therefore interpreted as the fourth data symbol. Similarly the sixth data symbol is erroneously treated as the fifth data symbol, and the n-th data symbol is erroneously treated as the (n−1)-th data symbol. This is a serious situation wherein all data symbols after (and including) the fourth are all interpreted incorrectly based upon the agreed upon data format. This easily exceeds the capability of the typical error correction arrangements of the decoder system and the entire data block will have to be retransmitted.

SUMMARY OF THE INVENTION

It is therefore a primary object of the present invention to provide an error-correcting virtual receiving buffer apparatus which allows for continuous normal data stream reception even when a data error condition arises during the transmission procedure.

It is another object of the present invention to provide an error-correcting virtual receiving buffer which allows for continuous normal data stream reception when a data error condition arises during transmission while simultaneously providing the correction of the flawed data symbols to avoid the necessity of data retransmission.

To achieve the above-identified objects, the present invention provides an error-correcting virtual receiving buffer apparatus comprising a buffer, a decoder and a buffer controller. The buffer is coupled to the decoder for temporarily containing encoded data coming from an external data source and for subsequently outputting the temporarily contained encoded data to the decoder for decoding. The buffer controller comprises a counter for maintaining the count of the data symbols of the encoded data lost during any data overflow situation. The buffer controller issues a buffer suspend control signal to the buffer for suspending subsequent data symbols of the incoming encoded data to prevent further data storage into a memory array of the buffer. The counter maintains a record of the number of the data symbols lost during data overflow, and the decoder performs error correction to recover the lost data symbols.

To achieve the above-identified objects, the present invention further provides an error-correcting virtual receiving buffer apparatus wherein the buffer controller further comprises an overflow detector. The counter of the buffer controller for maintaining the count of encoded data symbols lost during a data overflow comprises a data in-counter and a data out-counter. The data in-counter adds one to the count it maintained when a data symbol from the external data source is received in the buffer for temporary storage, and the data out-counter also adds one from the count it maintained when a data symbol held in the buffer is sent down stream to the decoder. The overflow detector compares the counts maintained by the data in-counter and the data out-counter respectively in order to determine the overflow status and the degree of overflow of the buffer.

BRIEF DESCRIPTION OF THE DRAWINGS

The invention will be described below in the embodiments as depicted in the drawings, in which.

DETAILED DESCRIPTION OF THE PREFERRED EMBODIMENT

Figure 1:
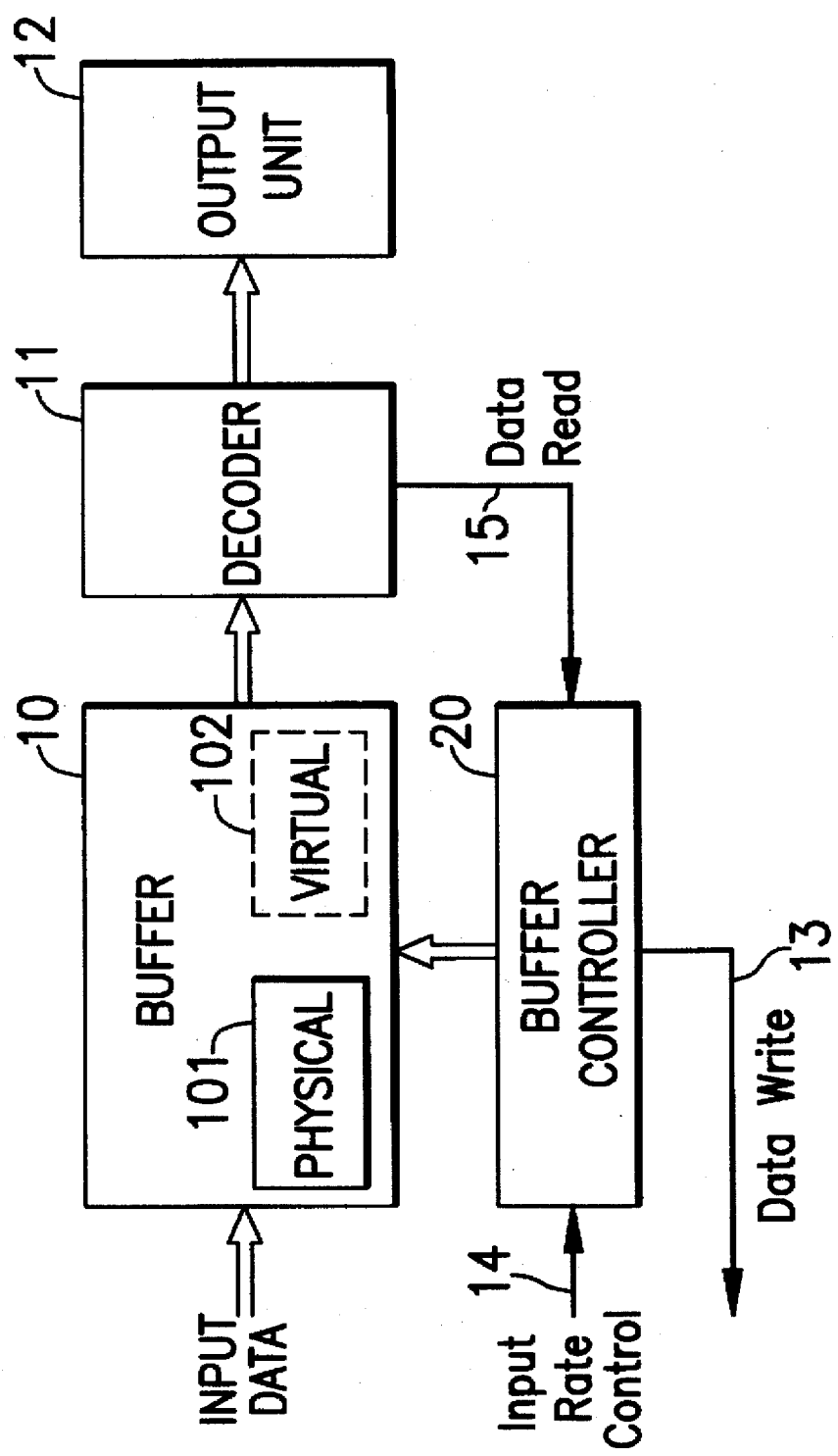
FIG. 1 (Prior Art) shows the block diagram of a conventional data receiving and decoding device.

FIG. 1 is a block diagram of a typical data receiving and decoding device. When such device employs an error-correcting virtual receiving buffer apparatus in accordance with the preferred embodiment of the present invention, it would have a buffer controller 20 as shown in FIG. 2.

Figure 2:
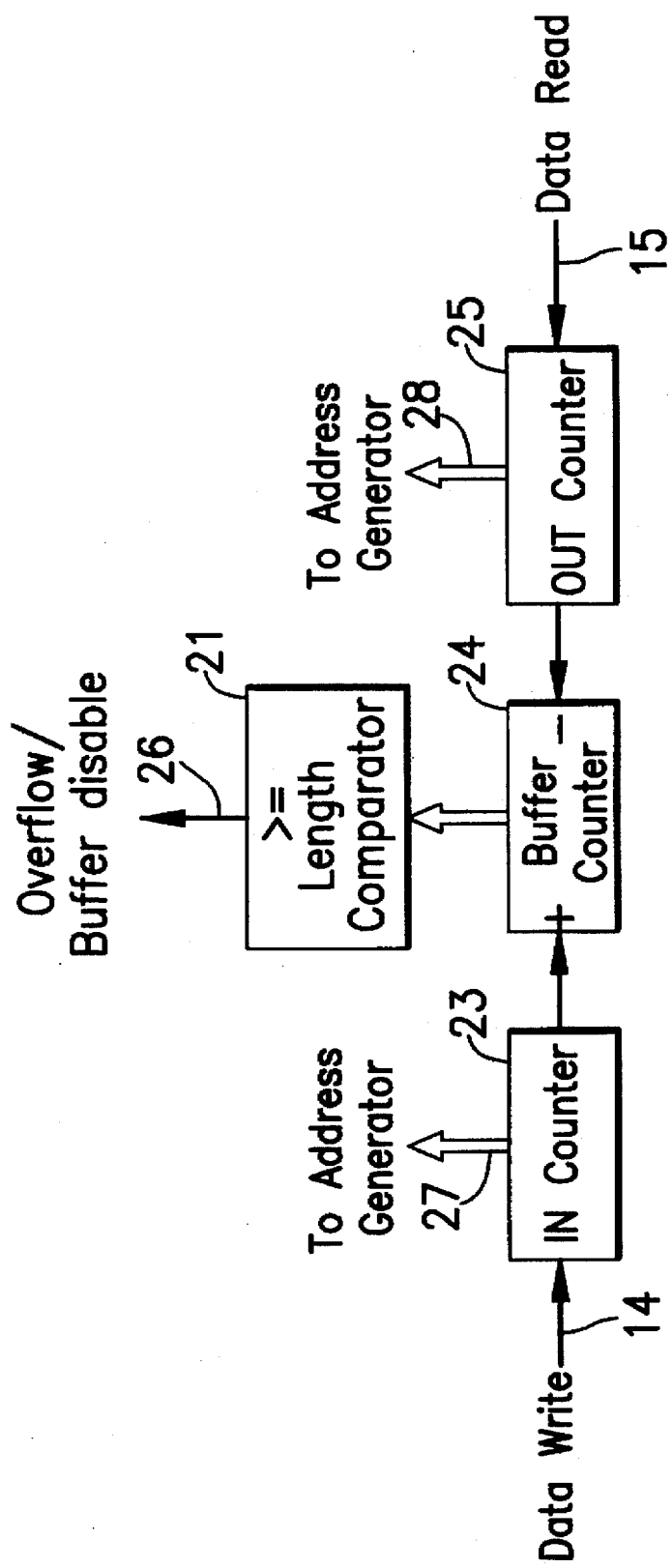
FIG. 2 shows the block diagram of the buffer controller of the error-correcting virtual receiving buffer apparatus in accordance with a preferred embodiment of the present invention.

The buffer controller of FIG. 2 includes a counter for counting data symbols lost during a data overflow. Under the control of the buffer controller 20, whenever the physical buffer space of the data receiving and decoding device which comprises an array of registers or memory locations is full but the encoded data keeps coming in, only a record of how many data symbols are input without being successfully buffered is maintained. The physical content of the data symbols missed as the result of the full condition of the buffer is not actually recorded. This allows for the correct tracking of the data format being currently received.

For example, assume there has been a data overflow condition in existence due to a full load of memory space in the buffer, causing the loss of three consecutive data symbols that are not successfully recorded in the buffer. The buffer overflow condition is then relieved before the arrival of the first data symbol after the three data symbols that are lost, and the buffer may continue its normal reception of the incoming encoded data stream again.

Although the decoding system did not successfully receive the correct data content of the three missed data symbols, the system, however, does have a record that three data symbols have been lost during transmission of the current data block, and the system also knows which specific three they are. The system may thus have an opportunity to recover the content of the three lost data symbols at a later and more appropriate time, utilizing the error correction capability of the decoder logic. This allows the system to avoid the situation of a flawed data stream format, and the data reception process may continue even though there has been the missed reception of several data symbols. This also avoids the need for a time-consuming retransmission of an entire data block. All these can be achieved in the error-correcting virtual receiving buffer apparatus of the present invention without excessive complication of hardware logic.

During the process of encoded data transmission, input encoded data symbols are successively recorded into the encoded data receiving buffer 10. The buffer 10 may include a physical memory stack 101 (see FIG. 1) and a virtual memory stack 102 (see FIG. 2). Under normal circumstances, the buffer 10 is programmed to subsequently receive incoming data symbols in an orderly manner and buffer them in the physical memory stack 101. In a similar manner, the buffer 10 subsequently dispatches the buffered data symbols in the same orderly manner into the decoder 11 coupled at its downstream end of data flow. However, when there is any data overflow situation arising within the physical memory stack 101 of the buffer 10, the buffer controller 20 as shown in FIG. 2 may control and maintain the correct flow of incoming encoded data symbols. This is achieved by the buffer controller 20 by instructing the virtual memory stack 102 to conduct a counting of the number of the missed data which have not been successfully recorded in the physical memory stack 101 as a result of the data overflow situation.

FIG. 2 is a block diagram of the buffer controller. The buffer controller 20 comprises an encoded data in-counter 23, a data out-counter 25, a buffer counter 24, and a data length comparator 21. During decoding, every block of the encoded data received from the external source that is temporarily stored in the buffer 10 (FIG. 1) and subsequently output from the buffer 10 to the decoder 11 (FIG. 1) for decoding, is monitored by the encoded data in-counter 23 and the data out-counter 25 for maintaining the exact data symbol number counting control.

In other words, whenever a data symbol is to be held in the buffer 10, the external logic issues a data write signal 14, so that the in-counter 23, as well as the buffer counter 24, adds one to the count they each maintains. Meanwhile, the count maintained by the in-counter 23 is also relayed in the bus 27 to the address generator of the system, indicating the address the received data symbol is to be held in the buffer 10.

In a similar manner, whenever a data symbol is to be retrieved from the buffer 10 for subsequent operations, the external logic issues a data read signal 15, so that the out-counter 25 adds one to the count it maintains. The count maintained by the out-counter 25, likewise, is also relayed in the bus 28 to the address generator of the system to indicate the address of the data symbol to be retrieved from the buffer 10.

Different from the case in the data storage in the buffer, however, the buffer counter 24 subtracts, instead of adds, one from the count it maintains when a data symbol is retrieved from the buffer 10 as signified by the issue of the data read signal 15. Thus, the count maintained by the buffer counter 24 is increased by one whenever a data symbol is stored therein, and decreased by one whenever a data symbol is retrieved therefrom. In other words, the count maintained in the buffer counter 24 can be utilized to reflect the amount of data symbols held in the buffer 10 of the system.

Therefore, if the initial count of the buffer counter 24 is preset to the number of the total memory locations for data symbols that may be held in the buffer 10, whenever the count maintained by the buffer counter 24 is smaller than this total storage space in the buffer 10, then there is still room to store the data symbols that keep coming into the system from the external source. On the other hand, if the count maintained by the buffer counter 24 is equal to or larger than the total storage space in the buffer 10, then there is no more room in the buffer 10 to store any incoming data symbol, and a condition of data overflow occurs.

The length comparator 21 of the buffer controller 20 may thus be utilized to monitor the overflow status of the system by constantly comparing the value of the count maintained by the buffer counter 24 to the total storage space of the buffer 10. Whenever the count in the buffer counter 24 is equal to or larger than the space of the buffer 10, the buffer disable signal 26 is then issued by the length comparator 21 to initiate an overflow condition of the system. This prevents any further input of the external data symbol to avoid situation that the data symbols already in the buffer 10 being inadequately masked.

Basically, in the system of the present invention, whenever a data overflow condition is determined by the length comparator 21 to have arisen in the buffer 10, the buffer 10 is controlled to temporarily suspend its reception of incoming encoded data symbols into its physical memory stack 101 by its reception of the buffer disable signal 26. Meanwhile, if the encoded data receiving and decoding system is equipped with the capability of controlling the external data incoming rate, it may issue the input rate control signal 13 to the external data source for requesting to adjust the data incoming rate based on the degree of data overflow detected by the length comparator 21 in the buffer controller 20. Usually, when a data overflow situation is detected, the external data source is normally instructed to reduce its data transmitting rate, allowing for the encoded data receiving and decoding system to catch up its flow of data decoding procedure. This also allows for the prevention of the serious situation wherein the number of missed data symbols exceeds its capability of error correction. If such situation does occur, the retransmission of the flawed data block is then inevitable. On the other hand, whenever the data overflow situation is relieved, and the data reception procedure returns normal again, the data transmission rate of the external data source may be adjusted to be higher via the input rate control signal 13 issuing the proper instruction, so that the system throughput may be increased to its possible maximum.

Hence, whenever there is any data overflow condition arises in the error-correcting virtual receiving buffer apparatus of the present invention, the entire encoded data receiving and decoding system may still be able to continuously process it reception and decoding of the incoming data without any interruption. Meanwhile, the system simultaneously maintains the record of the lost data symbols if an overflow condition does occur, and subsequently correct the missed data symbols at the later proper occasion when allowed utilizing its equipped error-correction capability. The apparatus of the present invention maintains the correct data stream format by virtually counting the missed data in a virtual memory stack of the buffer. Thus, although several of the data symbols along the transmitted data stream were not actually received in the data overflow situation, the system still does not have to request for the data retransmission so long as the data overflow was not involved in serious situations such as burst data errors.

Figure 3A:
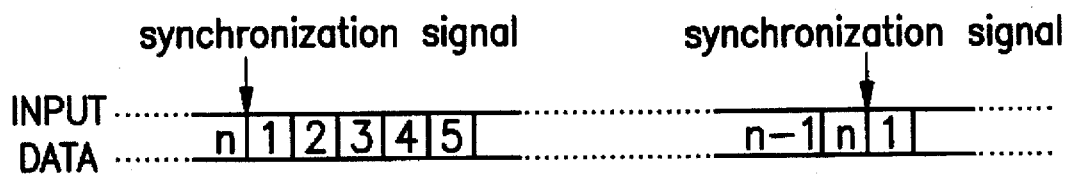
FIG. 3a schematically shows the format of a data stream under normal data transmission conditions.
Figure 3B:
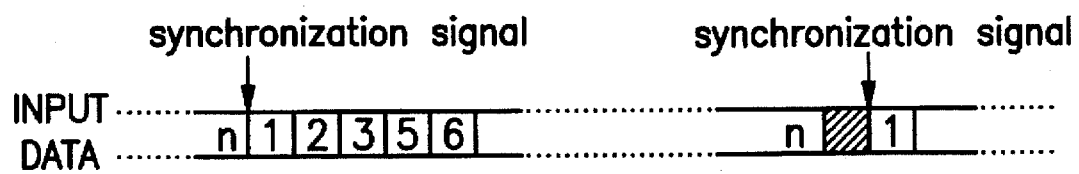
FIG. 3b schematically shows a data stream if the type shown in FIG. 3a, that has been corrupted by a data overflow during transmission.
Figure 3C:
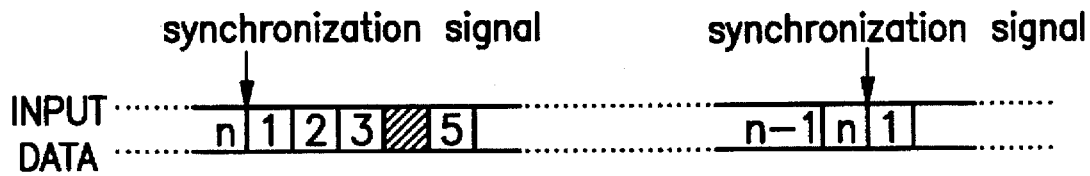
FIG. 3c schematically shows a data stream of the FIG. 3a type when encountering a data overflow during transmission procedure but correctly sustaining the entire data reception procedure utilizing the apparatus in accordance with the preferred embodiment of the present invention.

For example, FIG. 3c shows the arrangement of data in a stream of the type shown in FIG. 3a when encountering a data overflow condition during the transmission procedure but correctly sustaining the entire data block reception procedure utilizing the apparatus in accordance with the preferred embodiment of the present invention. As is seen in the drawing, the fourth data symbol suffered an overflow condition and was not successfully received in the buffer, but the successive data symbols after the missed fourth were still received correctly without interruption. The entire data block format may thus be maintained correctly, allowing the missed fourth data symbol to be recovered later utilizing the error correction capability of the system.

What is claimed is:

1. An error-correcting virtual receiving buffer apparatus comprising a buffer, a decoder and a buffer controller, said buffer being coupled to said decoder for temporarily containing encoded data incoming from an external data source and for subsequently outputting said temporarily contained encoded data to said decoder for decoding, wherein said buffer controller comprises a counting means for maintaining the count of the data symbols of said encoded data lost in a data overflow condition in said buffer, said buffer controller issuing a buffer suspend control signal to said buffer for suspending subsequent data symbols of said incoming encoded data from storing into the memory array of said buffer, said counting means maintaining a record of the number of said data symbols lost in said data overflow condition, and said decoder performing error correction schemes for recovering said lost data symbols.

2. A buffer apparatus according to claim 1, wherein said buffer controller further comprises a length comparator wherein said counting means of said buffer controller comprises a data in-counter, a data out-counter, and a buffer counter, said data in-counter adding one to the count maintained thereby, and said buffer counter adding one to the count maintained thereby when a data symbol from said external data source is received in said buffer for temporary storage, and said data out-counter adding one to the count maintained thereby, and said buffer counter deducting one from the count maintained thereby when a data symbol held in said buffer is sent to said decoder for decoding, and said length comparator comparing said counts maintained by said data in-counter and said data out-counter respectively for determining the overflow status and the degree of overflow of said buffer.

3. A buffer apparatus according to claim 2, wherein said length comparator includes means for issuing an input rate control signal to said external data source for causing to reduce the rate at which said data source is transmitting encoded data to said buffer when said length comparator detects an overflow condition in said buffer.

4. A buffer apparatus according to claim 3, wherein said length comparator includes means for issuing a request signal to said external data source requesting for retransmission of encoded data when said data symbols lost during an overflow condition cannot be recovered.

5. A buffer apparatus according to claim 4, wherein said length comparator includes means for issuing a request signal to said external data source requesting for increased data transmission rate for increasing the system throughput of the receiving and decoding of said encoded data to the maximum possible.

* * * * *